(12) United States Patent
Mizogami et al.

(10) Patent No.: US 8,461,618 B2
(45) Date of Patent: Jun. 11, 2013

(54) SEMICONDUCTOR LIGHT-EMITTING DEVICE AND METHOD OF PRODUCING THE SAME

(75) Inventors: Akinori Mizogami, Osaka (JP); Takanori Sonoda, Osaka (JP); Masahiko Sakata, Osaka (JP); Yoshimi Tanimoto, Osaka (JP); Motoi Nagamori, Osaka (JP); Daigaku Kimura, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 13/185,219

(22) Filed: Jul. 18, 2011

(65) Prior Publication Data

US 2012/0018765 A1  Jan. 26, 2012

(30) Foreign Application Priority Data

Jul. 20, 2010 (JP) ................................. 2010-162825

(51) Int. Cl.
*H01L 33/00* (2010.01)

(52) U.S. Cl.
USPC .................. 257/99; 257/98; 257/100; 438/22

(58) Field of Classification Search
USPC ........................ 257/98–100, E33.062; 438/22
See application file for complete search history.

(56) References Cited

U.S. PATENT DOCUMENTS

| 2008/0185606 | A1* | 8/2008 | Sano et al. | 257/98 |
| 2012/0032214 | A1* | 2/2012 | Ito et al. | 257/98 |

FOREIGN PATENT DOCUMENTS

| JP | 8-250769 | 9/1996 |
| JP | 9-205224 | 8/1997 |
| JP | 2008-135554 | 6/2006 |
| JP | 2008-210903 | 9/2008 |

* cited by examiner

*Primary Examiner* — Theresa T Doan
(74) *Attorney, Agent, or Firm* — Morrison & Foerster LLP

(57) ABSTRACT

A semiconductor light-emitting device includes a substrate, an n-type semiconductor layer located above the substrate, a semiconductor light-emitting layer located on the n-type semiconductor layer, a p-type semiconductor layer located on the semiconductor light-emitting layer. The semiconductor light-emitting device also includes an insulation film located on part of the p-type semiconductor layer in an unexposed section, a first transparent conductive film located on substantially the whole of the p-type semiconductor layer where the insulation film is not located in the unexposed section, and a second transparent conductive film located on the insulation film and the first transparent conductive film. The semiconductor light-emitting device further includes an n-side electrode located above the n-type semiconductor layer in an exposed section and electrically connected to the n-type semiconductor layer, and a p-side electrode located on the second transparent conductive film above the insulation film and electrically connected to the p-type semiconductor layer.

3 Claims, 7 Drawing Sheets

SEMICONDUCTOR LIGHT-EMITTING DEVICE AND METHOD OF PRODUCING THE SAME

This nonprovisional application is based on Japanese Patent Application No. 2010-162825 filed on Jul. 20, 2010 with the Japan Patent Office, the entire contents of which are hereby incorporated by reference.

BACKGROUND OF THE INVENTION

1. Field of the Invention

The present invention relates to a semiconductor light-emitting device and a method of producing the same, and more particularly to a semiconductor light-emitting device having a pad electrode that is opaque to light emitted from a semiconductor light-emitting layer, and a method of producing the same.

2. Description of the Background Art

An LED (Light Emitting Diode) chip which is a semiconductor light-emitting device produced using an AlGaInN-based nitride semiconductor can emit light of short wavelengths, such as blue, with high efficiency. Combining this LED chip and a phosphor provides a light-emitting apparatus that emits white light and the like. Such light-emitting apparatuses may exceed fluorescent lamps in luminous efficiency, and are considered to become the mainstream of future illumination. Accordingly, nitride semiconductor light-emitting devices are expected to be improved further in luminous efficiency and reliability and to be developed in energy saving.

In a nitride semiconductor light-emitting device with a nitride semiconductor layer formed on an insulation substrate, an electrode cannot be disposed at the rear surface side of the substrate. Therefore, a p-side electrode and an n-side electrode are disposed at the upper surface side of the substrate with the nitride semiconductor layer formed thereon.

The n-side electrode needs to be electrically connected to an n-type semiconductor layer. Therefore, to form the n-type semiconductor layer, a p-type nitride semiconductor layer and a semiconductor light-emitting layer need to be removed to expose an n-type nitride semiconductor layer. An unexposed section other than an exposed section having been exposed by etching represents a mesa (trapezoidal) form.

At the boundary between the unexposed section and the exposed section, an area where the ends of the n-type semiconductor layer, the semiconductor light-emitting layer and the p-type semiconductor layer are exposed will be referred to as an exposed end. Since the pn junction is exposed at the exposed end, a leakage current occurs when the pn junction in the exposed section is contaminated.

Japanese Patent Laying-Open No. 9-205224 (Patent Literature 1) is a conventional literature that discloses a nitride semiconductor light-emitting device having an insulation film in order to protect the exposed end. In the nitride semiconductor light-emitting device disclosed in Patent Literature 1, the insulation film is formed on a surface of the exposed end.

Since an opaque p-side pad electrode is disposed on the p-type nitride semiconductor layer, light emitted from the semiconductor light-emitting layer located under the p-side pad electrode is blocked by the p-side pad electrode from outgoing from the upper surface of the nitride semiconductor light-emitting device. Accordingly, the light extraction efficiency of the semiconductor light-emitting device deteriorates.

Japanese Patent Laying-Open No. 8-250769 (Patent Literature 2) is a conventional literature that discloses a semiconductor light-emitting device with a high resistance layer formed therein in order to reduce a value of current flowing through part of a p-type semiconductor layer that is located under a p-side pad electrode. In the semiconductor light-emitting device disclosed in Patent Literature 2, the high resistance layer is disposed between a transparent electrode and the p-type semiconductor layer.

Japanese Patent Laying-Open No. 2008-210903 (Patent Literature 3) is a conventional literature that discloses a semiconductor light-emitting device with a p-side pad electrode disposed on an insulation film with a light-transmissive conductive film interposed therebetween. In the semiconductor light-emitting device disclosed in Patent Literature 3, a light-transmissive insulation film is disposed between the light-transmissive conductive film having an external connection part and a p-type semiconductor layer.

Japanese Patent Laying-Open No. 2008-135554 (Patent Literature 4) is a conventional literature that discloses a semiconductor light-emitting device with a transparent conductive film formed also under a light-transmissive insulation layer. In the semiconductor light-emitting device disclosed in Patent Literature 4, the layer thickness of a portion of the transparent conductive film formed under the light-transmissive insulation layer is smaller than that of the remaining portion of the transparent conductive film. This structure uniformly distributes current while increasing light emission around a pad electrode, thereby improving light extraction efficiency.

In a structure having an insulation film under a p-side electrode as in the semiconductor light-emitting devices disclosed in Patent Literatures 2 and 3, an ohmic contact between a transparent conductive film and a p-type semiconductor layer is less likely to be obtained. To obtain the ohmic contact between the transparent conductive film and the p-type semiconductor layer, an oxide existing at the interface between the transparent conductive film and the p-type semiconductor layer needs to be removed. Therefore, when forming the transparent conductive film on the p-type semiconductor layer, the p-type semiconductor layer is usually subjected to surface treatment using a cleaning solution to remove an oxide.

However, since a transparent conductive film is formed above the insulation film in the semiconductor light-emitting device having the insulation film under the p-side electrode, the insulation film is formed on the p-type semiconductor layer earlier than the transparent conductive film. When the surface of the p-type semiconductor layer with the insulation film formed thereon is subjected to surface treatment using a cleaning solution to remove an oxide, the insulation film will be removed with the cleaning solution. Therefore, in the semiconductor light-emitting device having the insulation film under the p-side electrode, a cleaning solution less capable of removing an oxide should be used in the surface treatment of the p-type semiconductor layer before forming the transparent conductive film. As a result, the ohmic contact between the transparent conductive film and the p-type semiconductor layer is less likely to be obtained. This also applies to a semiconductor light-emitting device having a transparent conductive film above an n-type semiconductor layer.

In the semiconductor light-emitting device disclosed in Patent Literature 4, the transparent conductive film is formed on a p-type semiconductor layer, and an insulation film is formed on the transparent conductive film. In this semiconductor light-emitting device, the transparent conductive film is formed on the p-type semiconductor layer earlier than the insulation film.

However, since transparent conductive films are formed on and under the insulation film, the path of current flowing through the semiconductor light-emitting device changes depending on the relation between the layer thickness of the transparent conductive film formed on the insulation film and that of the transparent conductive film formed under the insulation film. Thus, the emission characteristics vary among semiconductor light-emitting devices unless the layer thicknesses of the transparent conductive films formed on and under the insulation film are controlled strictly.

SUMMARY OF THE INVENTION

An object of the present invention is to provide a semiconductor light-emitting device having reduced contact resistance between a transparent conductive film and a semiconductor layer and stable emission characteristics, as well as a method of producing the same.

The inventors of the present invention focused attention on that a transparent conductive film formed on an insulation film and a transparent conductive film formed at the remaining location require different characteristics.

Characteristics required of the transparent conductive film formed at the location other than the insulation film include: (1) low contact resistance with an underlying p-type semiconductor layer; (2) low specific resistance and favorable current diffusivity; and (3) a thickness less than or equal to $\lambda/4n$ ($\lambda$ represents emission wavelength of LED, and n represents refractive index of a p-side transparent conductive film) in consideration of light interference.

Characteristics required of the transparent conductive film formed on the insulation film include low contact resistance with a p-side semiconductor electrode formed thereon.

In light of the foregoing, the present invention achieves the object by the following means.

A semiconductor light-emitting device according to the present invention includes a substrate, an n-type semiconductor layer located above the substrate, a semiconductor light-emitting layer located on the n-type semiconductor layer, and a p-type semiconductor layer located on the semiconductor light-emitting layer. The semiconductor light-emitting device also includes an exposed section in which both of the semiconductor light-emitting layer and the p-type semiconductor layer are partially absent on the n-type semiconductor layer when the substrate is seen two-dimensionally from above the substrate, and an unexposed section other than the exposed section. The semiconductor light-emitting device further includes an insulation film located on part of the p-type semiconductor layer in the unexposed section, a first transparent conductive film located on substantially the whole of the p-type semiconductor layer where the insulation film is absent in the unexposed section, and a second transparent conductive film located on the insulation film and the first transparent conductive film. The semiconductor light-emitting device furthermore includes an n-side electrode located above the n-type semiconductor layer in the exposed section and electrically connected to the n-type semiconductor layer, and a p-side electrode located on the second transparent conductive film above the insulation film and electrically connected to the p-type semiconductor layer.

Preferably, the semiconductor light-emitting device further includes a first protective film made of a material identical to that of the insulation film and covering an end face of the semiconductor light-emitting layer located at a boundary between the exposed section and the unexposed section, and a second protective film located to cover the first protective film.

In an embodiment of the present invention, the semiconductor light-emitting device further includes a third transparent conductive film located between the n-side electrode and the n-type semiconductor layer.

In a first aspect of the present invention, a method of producing a semiconductor light-emitting device includes the steps of preparing a substrate, forming an n-type semiconductor layer above the substrate, forming a semiconductor light-emitting layer above the substrate on which the n-type semiconductor layer has been formed, forming a p-type semiconductor layer above the substrate on which the semiconductor light-emitting layer has been formed, forming a first transparent conductive film on the p-type semiconductor layer, and partially removing the first transparent conductive film. The method of producing a semiconductor light-emitting device also includes the steps of partially removing the first transparent conductive film, the p-type semiconductor layer and the semiconductor light-emitting layer by etching to form an exposed section in which the n-type semiconductor layer is exposed and an unexposed section other than the exposed section, and forming an insulation film in an area where the first transparent conductive film has been removed. The method of producing a semiconductor light-emitting device further includes the steps of forming a second transparent conductive film on the insulation film and the first transparent conductive film, forming an n-side electrode above the n-type semiconductor layer in the exposed section to be electrically connected to the n-type semiconductor layer, and forming a p-side electrode on the second transparent conductive film above the insulation film to be electrically connected to the p-type semiconductor layer.

In a second aspect of the present invention, a method of producing a semiconductor light-emitting device includes the steps of preparing a substrate, forming an n-type semiconductor layer above the substrate, forming a semiconductor light-emitting layer above the substrate on which the n-type semiconductor layer has been formed, and forming a p-type semiconductor layer above the substrate on which the semiconductor light-emitting layer has been formed. The method of producing a semiconductor light-emitting device also includes the steps of partially removing the p-type semiconductor layer and the semiconductor light-emitting layer by etching to form an exposed section in which the n-type semiconductor layer is exposed and an unexposed section other than the exposed section, and forming a first transparent conductive film on the p-type semiconductor layer in the unexposed section. The method of producing a semiconductor light-emitting device further includes the steps of partially removing the first transparent conductive film, forming an insulation film in an area where the first transparent conductive film has been removed, and forming a second transparent conductive film on the insulation film and the first transparent conductive film. The method of producing a semiconductor light-emitting device furthermore includes the steps of forming an n-side electrode above the n-type semiconductor layer in the exposed section to be electrically connected to the n-type semiconductor layer, and forming a p-side electrode on the second transparent conductive film above the insulation film to be electrically connected to the p-type semiconductor layer.

In an embodiment of the present invention, in the step of forming the second transparent conductive film, a third transparent conductive film is formed between the n-side electrode and the n-type semiconductor layer.

In a third aspect of the present invention, a method of producing a semiconductor light-emitting device includes the steps of preparing a substrate, forming an n-type semiconductor layer above the substrate, forming a semiconductor light-emitting layer above the substrate on which the n-type semiconductor layer has been formed, and forming a p-type semiconductor layer above the substrate on which the semiconductor light-emitting layer has been formed. The method of producing a semiconductor light-emitting device also includes the steps of forming a first transparent conductive film on the p-type semiconductor layer, partially removing the first transparent conductive film, forming an insulation film in an area where the first transparent conductive film has been removed, and forming a second transparent conductive film on the insulation film and the first transparent conductive film. The method of producing a semiconductor light-emitting device further includes the step of partially removing the second transparent conductive film, the first transparent conductive film, the p-type semiconductor layer, and the semiconductor light-emitting layer by etching to form an exposed section in which the n-type semiconductor layer is exposed and an unexposed section other than the exposed section. The method of producing a semiconductor light-emitting device furthermore includes the steps of forming an n-side electrode above the n-type semiconductor layer in the exposed section to be electrically connected to the n-type semiconductor layer, and forming a p-side electrode on the second transparent conductive film above the insulation film to be electrically connected to the p-type semiconductor layer.

The present invention further includes a surface treatment step using a cleaning solution for removing an oxide immediately prior to the step of forming the first transparent conductive film.

According to the present invention, a semiconductor light-emitting device having reduced contact resistance between a transparent conductive film and a semiconductor layer and stable emission characteristics, as well as a method of producing the same can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
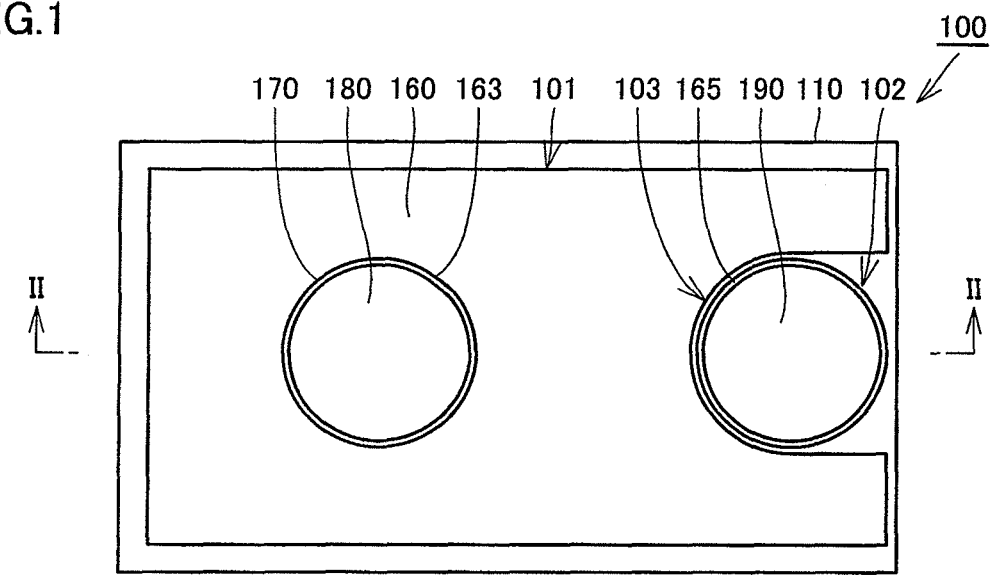
FIG. 1 is a plan view showing a structure of a semiconductor light-emitting device according to a first embodiment of the present invention.

Hereinafter, a semiconductor light-emitting device and a method of producing the same according to the first embodiment of the present invention will be described with reference to the drawings. In the following description of embodiments, like parts are denoted by like reference characters, and repeated description is not provided.

First Embodiment

Figure 2:
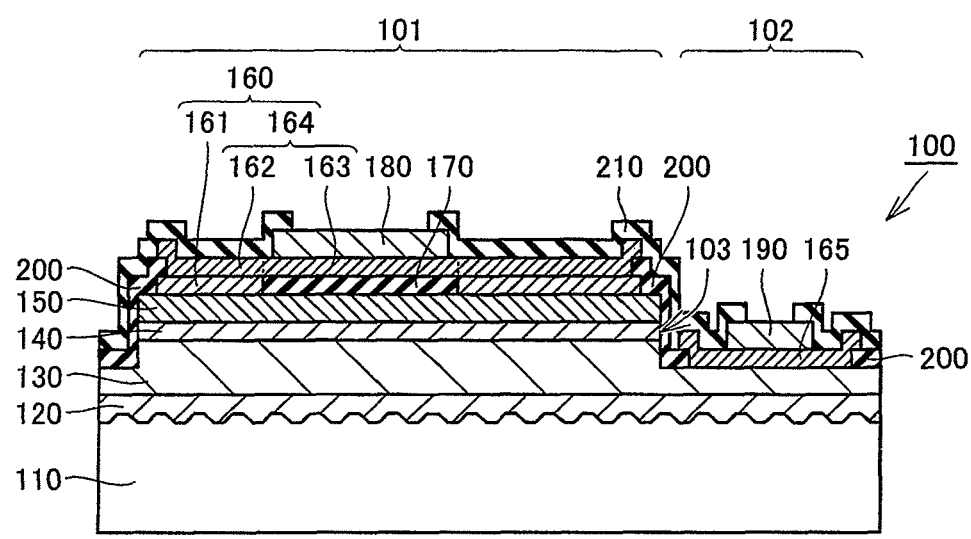
FIG. 2 is a cross-sectional view seen in the arrow direction of line II-II in FIG. 1.

FIG. 1 is a plan view showing a structure of the semiconductor light-emitting device according to the first embodiment of the present invention. FIG. 2 is a cross-sectional view seen in the arrow direction of line II-II in FIG. 1. It is noted that, for the sake of simplicity, FIG. 1 does not illustrate details, such as a first protective film 200 and a second protective film 210.

As shown in FIGS. 1 and 2, when a substrate 110 is seen two-dimensionally from above substrate 110, an undoped nitride semiconductor layer 120 made of an undoped GaN is formed on the surface of substrate 110 having a rectangular configuration. An n-type semiconductor layer 130 made of an AlGaInN-based material is formed on the surface of undoped nitride semiconductor layer 120. A semiconductor light-emitting layer 140 made of an AlGaInN-based material is formed on the surface of part of n-type semiconductor layer 130. A p-type semiconductor layer 150 made of an AlGaInN-based material is formed on the surface of semiconductor light-emitting layer 140. The AlGaInN-based material is a material containing at least one kind of Al, Ga and In as a Group III material and N as a Group V material, and may be composed of a plurality of layers having different compositions.

When substrate 110 is seen two-dimensionally from above substrate 110, an exposed section 102 where both of semiconductor light-emitting layer 140 and p-type semiconductor layer 150 are partially absent on n-type semiconductor layer 130. An unexposed section 101 is formed at a location other than exposed section 102. Unexposed section 101 has a trapezoidal form, and is so-called a mesa region. At the boundary between unexposed section 101 and exposed section 102, an area where the ends of n-type semiconductor layer 130, semiconductor light-emitting layer 140 and p-type semiconductor layer 150 are exposed will be referred to as an exposed end 103.

In exposed section 102, a third transparent conductive film 165 is formed on the surface of n-type semiconductor layer 130. An n-side electrode 190 is formed on the surface of third transparent conductive film 165. N-side electrode 190 is electrically connected to n-type semiconductor layer 130 with third transparent conductive film 165 interposed therebetween.

In unexposed section 101, an insulation film 170 is formed on the surface of part of p-type semiconductor layer 150. In unexposed section 101, a first transparent conductive film 161 is formed on substantially the whole surface of p-type semiconductor layer 150 except where insulation film 170 is located. A second transparent conductive film 164 is formed on insulation film 170 and first transparent conductive film 161. Second transparent conductive film 164 includes a first region 163 formed on the surface of insulation film 170, and a second region 162 formed on the surface of first transparent conductive film 161.

In unexposed section 101, a p-side electrode 180 is formed on the surface of first region 163. P-side electrode 180 is electrically connected to p-type semiconductor layer 150 with transparent conductive film 160 interposed therebetween. Transparent conductive film 160 includes first transparent conductive film 161 and second transparent conductive film 164.

As shown in FIG. 1, p-side electrode 180 has a circular configuration. N-side electrode 190 also has a circular configuration. Substrate 110 of the present embodiment has a rectangular configuration whose longitudinal length is about 550 μm and lateral length is about 280 μm.

A method of producing semiconductor light-emitting device 100 according to the present embodiment will now be described.

Figure 3:
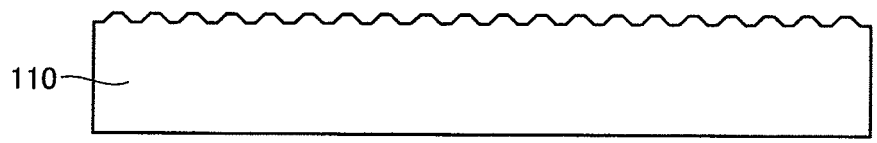
FIG. 3 is a cross-sectional view showing a substrate used for the semiconductor light-emitting device according to the first embodiment.

(Substrate)
First, substrate 110 is prepared. FIG. 3 is a cross-sectional view showing the substrate used for the semiconductor light-emitting device according to the present embodiment. In the present embodiment, as shown in FIG. 3, used as substrate 110 is a sapphire substrate in which portions have been removed by dry etching to form recesses such that projections having a height of about 1 μm remain at the surface with a 4-μm pitch. It is noted that a sapphire substrate having a flat surface may be used as substrate 110.

Figure 4:
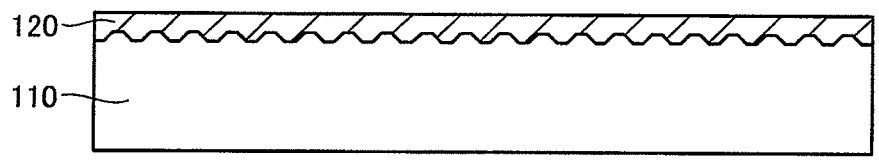
FIG. 4 is a cross-sectional view showing a state where an undoped nitride semiconductor layer has been formed on the substrate.
Figure 5:
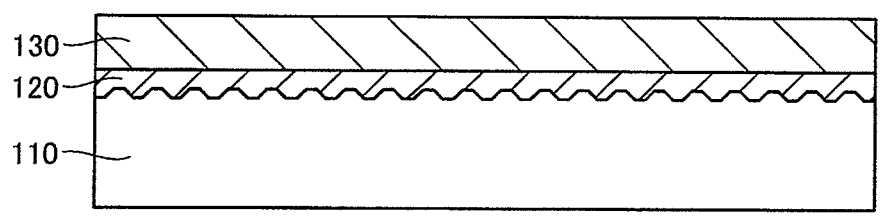
FIG. 5 is a cross-sectional view showing a state where an n-type semiconductor layer has been formed on the undoped nitride semiconductor layer.

(Semiconductor Layer)
FIG. 4 is a cross-sectional view showing a state where an undoped nitride semiconductor layer has been formed on the substrate. As shown in FIG. 4, undoped nitride semiconductor layer 120 is formed by MOCVD (Metal Organic Chemical Vapor Deposition) on substrate 110. FIG. 5 is a cross-sectional view showing a state where an n-type semiconductor layer has been formed on the undoped nitride semiconductor layer. As shown in FIG. 5, n-type semiconductor layer 130 made of an AlGaInN-based material is formed on undoped nitride semiconductor layer 120 by MOCVD.

Figure 6:
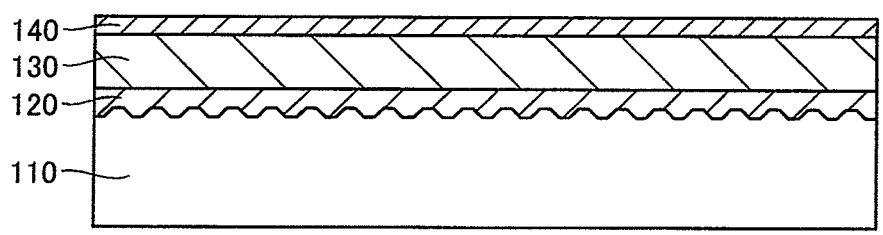
FIG. 6 is a cross-sectional view showing a state where a semiconductor light-emitting layer has been formed on the n-type semiconductor layer.
Figure 7:
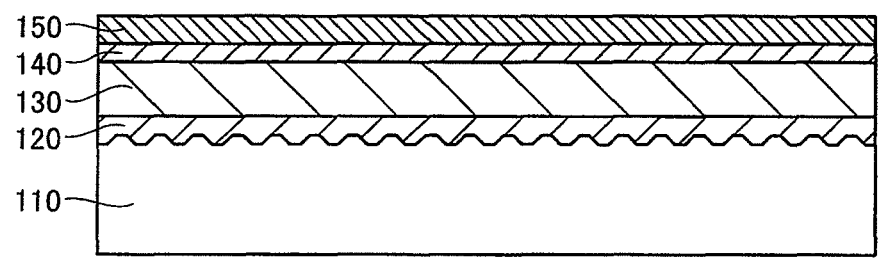
FIG. 7 is a cross-sectional view showing a state where a p-type semiconductor layer has been formed on the semiconductor light-emitting layer.

FIG. 6 is a cross-sectional view showing a state where a semiconductor light-emitting layer has been formed on the n-type semiconductor layer. As shown in FIG. 6, semiconductor light-emitting layer 140 is formed on n-type semiconductor layer 130 by MOCVD. FIG. 7 is a cross-sectional view showing a state where a p-type semiconductor layer has been formed on the semiconductor light-emitting layer. As shown in FIG. 7, p-type semiconductor layer 150 is formed on semiconductor light-emitting layer 140 by MOCVD.

Figure 8:
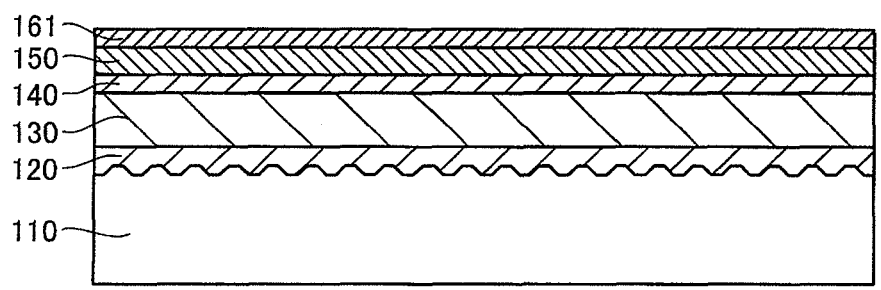
FIG. 8 is a cross-sectional view showing a state where a first transparent conductive film has been formed on a surface of the p-type semiconductor layer.

(First Transparent Conductive Film)
FIG. 8 is a cross-sectional view showing a state where a first transparent conductive film has been formed on a surface of the p-type semiconductor layer. As shown in FIG. 8, after surface treatment using HF (hydrofluoric acid), ITO (Indium Tin Oxide) is formed on p-type semiconductor layer 150 by sputtering as first transparent conductive film 161. It is noted that the surface treatment may be unnecessary immediately after formation of p-type semiconductor layer 150. The surface treatment is not limited to that using hydrofluoric acid, but a cleaning solution containing buffered hydrofluoric acid and a mixture thereof and capable of removing an oxide can be used suitably.

Figure 9:
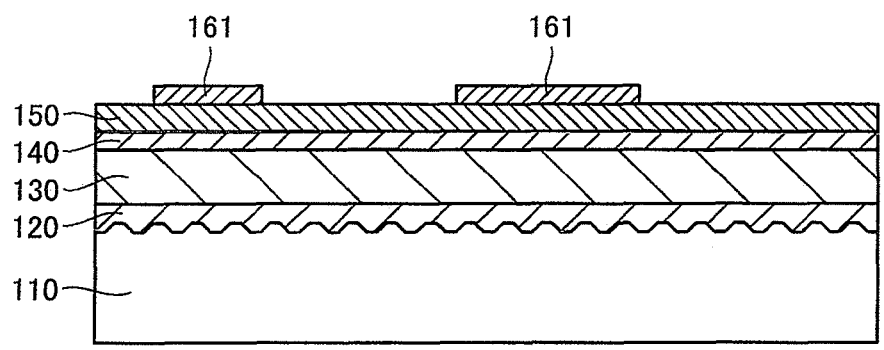
FIG. 9 is a cross-sectional view showing a state where the first transparent conductive film has been patterned.

FIG. 9 is a cross-sectional view showing a state where the first transparent conductive film has been patterned. As shown in FIG. 9, first transparent conductive film 161 is patterned by photolithography, so that an unnecessary portion is removed. It is noted that a lift-off technique may be adopted for patterning first transparent conductive film 161 by which first transparent conductive film 161 is formed after a resist is formed, and an unnecessary portion of first transparent conductive film 161 is removed together with the resist.

After patterning, first transparent conductive film 161 is annealed, so that the transparency of first transparent conductive film 161 is increased. Annealing may be performed once or several times in oxygen, nitrogen, or in a vacuum under a temperature condition about more than or equal to 300° C. and less than or equal to 800° C. It is noted that, since annealing is also performed after formation of the second transparent conductive film as will be described later, annealing after formation of first transparent conductive film 161 may be omitted.

Figure 10:
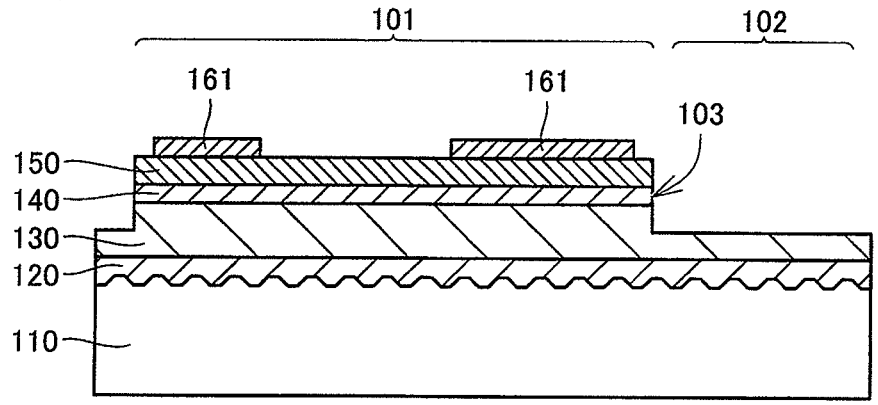
FIG. 10 is a cross-sectional view showing a state where an exposed section and an unexposed section have been formed on the substrate.

(Exposed Section)
FIG. 10 is a cross-sectional view showing a state where the exposed section and the unexposed section have been formed on the substrate. As shown in FIG. 10, p-type semiconductor layer 150 and semiconductor light-emitting layer 140 in an area to constitute exposed section 102 are removed by dry etching to expose n-type semiconductor layer 130. Accordingly, the remaining area constitutes unexposed section 101, and exposed end 103 is formed at the boundary between unexposed section 101 and exposed section 102.

Figure 11:
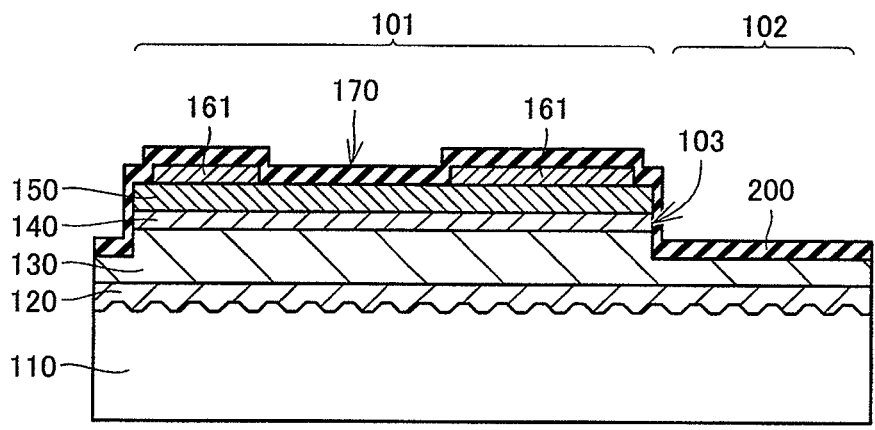
FIG. 11 is a cross-sectional view showing a state where a $SiO_2$ film has been formed on the surface in the exposed section and the unexposed section.

(Insulation Film and First Protective Film)
FIG. 11 is a cross-sectional view showing a state where a SiO$_2$ film has been formed on the surface in the exposed section and the unexposed section. As shown in FIG. 11, the SiO$_2$ film is formed on the whole surface in exposed section 102 and unexposed section 101 by plasma CVD.

Figure 12:
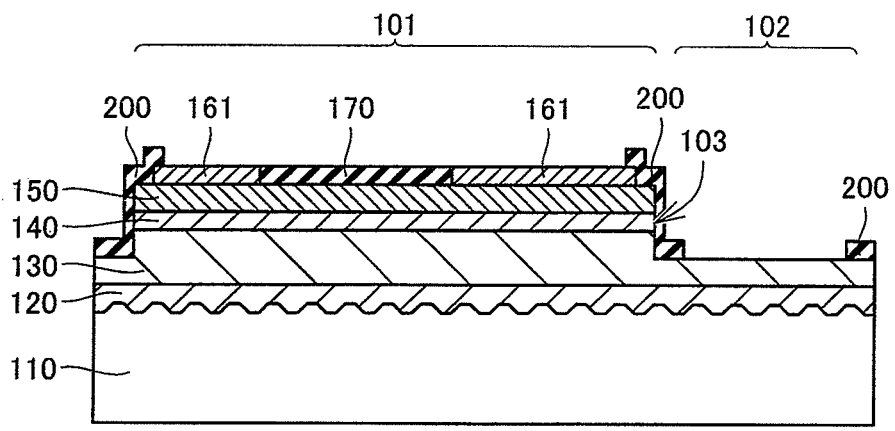
FIG. 12 is a cross-sectional view showing a state where the insulation film has been patterned.

FIG. 12 is a cross-sectional view showing a state where the insulation film has been patterned. As shown in FIG. 12, a resist pattern is formed on the SiO$_2$ film by photolithography, and then an unnecessary portion of the SiO$_2$ film is removed by etching. As a result, insulation film 170 is formed on part of p-type semiconductor layer 150 in unexposed section 101. Exposed end 103 is covered with a first protective film 200. By forming first protective film 200 immediately after forming exposed end 103 at which semiconductor light-emitting layer 140 is exposed, a leakage current at the pn junction at exposed end 103 is reduced, while the semiconductor light-emitting device is improved in reliability.

Although SiO$_2$ is used for insulation film 170 and first protective film 200 in the present embodiment, Si$_3$N$_4$, Al$_2$O$_3$, TiO$_2$, ZrO$_2$, or the like may be used. It is noted that a lift-off technique may be adopted for patterning insulation film 170 and first protective film 200 by which the SiO$_2$ film is formed after a resist is formed, and an unnecessary portion of the SiO$_2$ film is removed together with the resist. It is noted that only insulation film 170 may be formed without forming first protective film 200, and the remaining portion of the SiO$_2$ film may be removed as an unnecessary portion. In that case, a predetermined portion shall be protected by a second protective film, which will be described later.

(Second Transparent Conductive Film)

Figure 13:
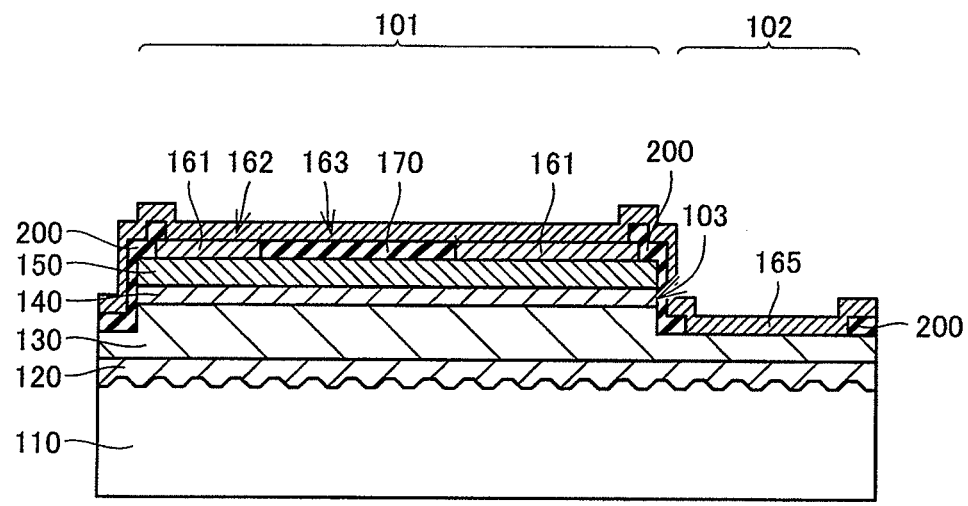
FIG. 13 is a cross-sectional view showing a state where a transparent conductive film has been formed on the surface in the exposed section and the unexposed section.

FIG. 13 is a cross-sectional view showing a state where a transparent conductive film has been formed on the surface in the exposed section and the unexposed section. As shown in FIG. 13, after surface treatment is performed using a cleaning solution less capable of removing an oxide, ITO is formed as a transparent conductive film on the whole surface in exposed section 102 and unexposed section 101 by sputtering, and is annealed.

Figure 14:
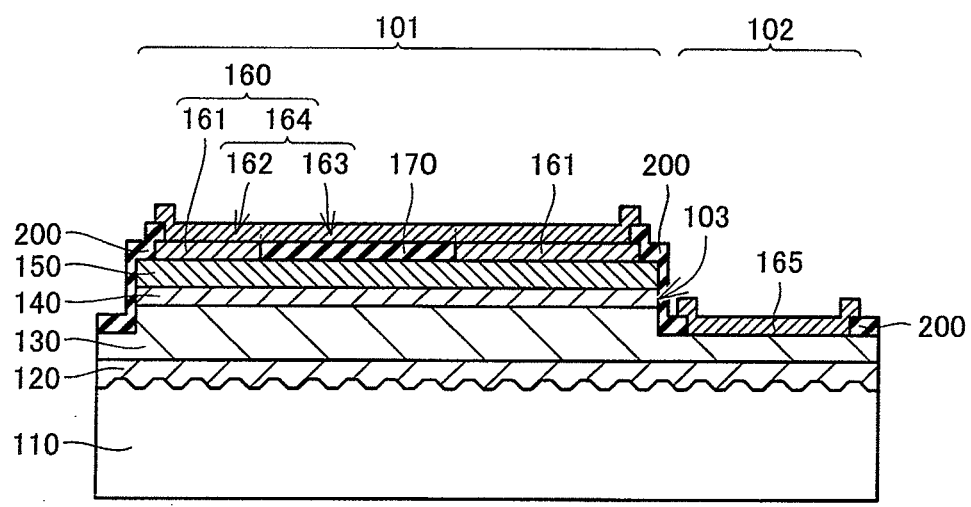
FIG. 14 is a cross-sectional view showing a state where the transparent conductive film has been patterned.

FIG. 14 is a cross-sectional view showing a state where the transparent conductive film has been patterned. As shown in FIG. 14, the transparent conductive film is patterned by photolithography, and an unnecessary portion is removed. Second transparent conductive film 164 formed in unexposed section 101 includes first region 163 formed on insulation film 170, and second region 162 formed on first transparent conductive film 161. In exposed section 102, third transparent conductive film 165 is formed on n-type semiconductor layer 130.

By forming the first transparent conductive film and the second transparent conductive film as described above, the transparent conductive films have a single layer structure only composed of first region 163 in the area where insulation film 170 is located in unexposed section 101, while in the remaining area, the transparent conductive film has a double layered structure composed of first transparent conductive film 161 and second region 162. As a result, in unexposed section 101, the transparent conductive film in the area where insulation film 170 is located is formed thinner than the transparent conductive film in the remaining area.

It is noted that a lift-off technique may be adopted for patterning the transparent conductive film by which the transparent conductive film is formed after a resist is formed, and an unnecessary portion of the transparent conductive film is removed together with the resist. In the present embodiment, ITO is used for transparent conductive films 160 and 165, however, a material such as IZO (Indium Zinc Oxide) or ZnO may be used.

(Electrode)

Figure 15:
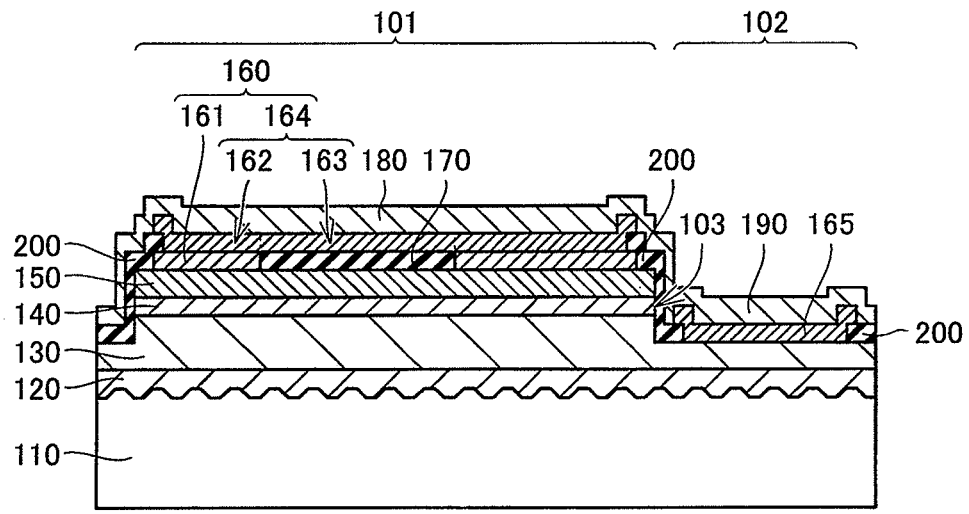
FIG. 15 is a cross-sectional view showing a state where an electrode material layer has been formed on the surface in the exposed section and the unexposed section.

FIG. 15 is a cross-sectional view showing a state where an electrode material layer has been formed on the surface in the exposed section and the unexposed section. As shown in FIG. 15, the electrode material layer having a layer structure of Ni/Pt/Au in the ascending order from the bottom is formed by sputtering on the surface in exposed section 102 and unexposed section 101. Although sputtering is used for forming the electrode material layer in the present embodiment, vapor deposition may be used.

Figure 16:
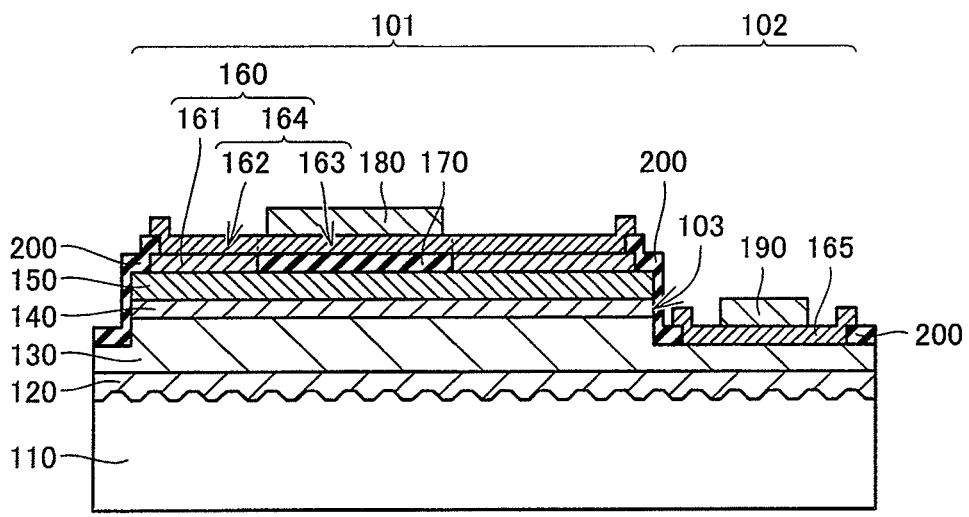
FIG. 16 is a cross-sectional view showing a state where the electrode material layer has been patterned.

FIG. 16 is a cross-sectional view showing a state where the electrode material layer has been patterned. As shown in FIG. 16, the electrode material layer is patterned by photolithography, and an unnecessary portion is removed. As a result, in exposed section 102, n-side electrode 190 electrically connected to n-type semiconductor layer 130 with third transparent conductive film 165 interposed therebetween is formed above n-type semiconductor layer 130. In the unexposed section, p-side electrode 180 electrically connected to p-type semiconductor layer 150 with first region 163 of second transparent conductive film 164 interposed therebetween is formed above insulation film 170.

It is noted that a lift-off technique may be adopted for patterning the electrode material layer by which the electrode material layer is formed after a resist is formed, and an unnecessary portion of the electrode material layer is removed together with the resist. The electrode material is not limited to the above-described materials, but a material such as that having a layered structure of Ni/Pd/Au or Ni/Rh/Au may be used.

(Second Protective Film)

Figure 17:
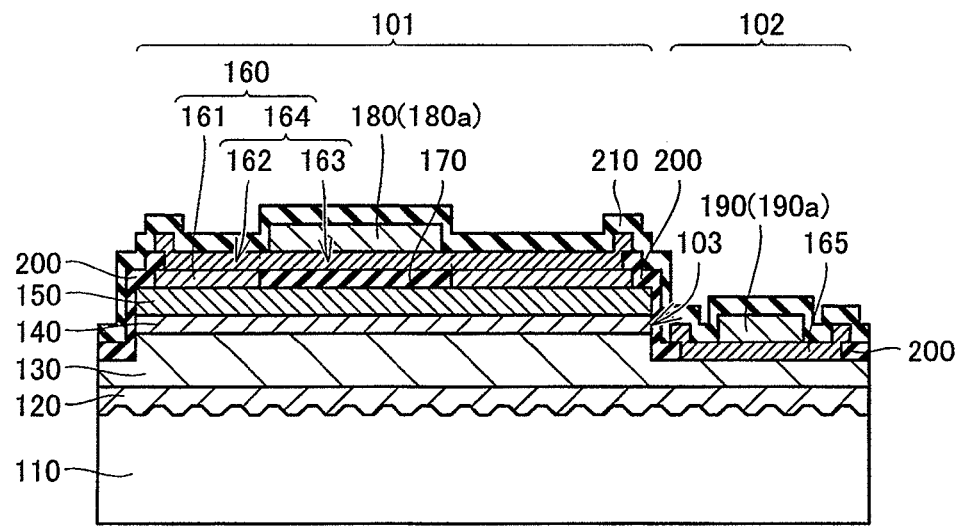
FIG. 17 is a cross-sectional view showing a state where a $SiO_2$ film has been formed on the surface in the exposed section and the unexposed section.

FIG. 17 is a cross-sectional view showing a state where a SiO$_2$ film has been formed on the surface in the exposed section and the unexposed section. As shown in FIG. 17, the SiO$_2$ film is formed on the whole surface in exposed section 102 and unexposed section 101 by plasma CVD. The SiO$_2$ film on a p-side pad electrode portion 180a and an n-side pad electrode portion 190a is removed by photolithography, so that semiconductor light-emitting device 100 having a cross-sectional structure shown in FIG. 2 is formed. Although SiO$_2$ is used for second protective film 210 in the present embodiment, Si$_3$N$_4$, Al$_2$O$_3$, TiO$_2$, ZrO$_2$, or the like may be used for second protective film 210.

(Chip Separation)

The above steps are performed on the whole wafer including thousands of LED chips. After inspection of LED chips, kerfs for separation are formed in the wafer by laser scribing. The wafer with the kerfs for separation formed therein is applied to a sheet, and then pressure is applied to the whole wafer so as to separate the wafer into chips. Although laser scribing is used for forming the kerfs for separation in the present embodiment, scribing or dicing using a hard needle made of diamond, for example, or the like may be used.

(Packaging)

Each separated semiconductor light-emitting device 100 is subjected to die bonding to form a package, and each of p-side pad electrode portion 180a and n-side pad electrode portion 190a is wire-bonded to be connected to a wire mainly made of Au.

In the package, a silicone resin raw material (fluid) mixed with green phosphor particles made of β-SiAlON and red phosphor particles made of CaAlSiN$_3$ is injected so as to cover semiconductor light-emitting device 100, and is then cured by heating. It is noted that, as phosphors, those excited by blue LEDs to emit light of green, yellow, orange, red, and the like are used as appropriate.

Through the above-described steps, a light-emitting apparatus including semiconductor light-emitting device 100 and phosphors is produced.

Confirmation results of emission characteristics of the semiconductor light-emitting device of the present embodiment will be provided below.

A test sample with semiconductor light-emitting device 100 wire-bonded to a stem was prepared, while omitting the above-described packaging step. This sample had light extraction efficiency lower than that of the above-described light-emitting apparatus due to the absence of resin sealing, and wavelength conversion was not performed therein since phosphors were not used.

A practical ohmic contact was not obtained in a conventional semiconductor light-emitting device in which a cleaning solution less capable of oxidization was used when forming a transparent conductive film on a p-type semiconductor layer. In the above-described sample, the contact resistance value between second region 162 made of ITO and p-type semiconductor layer 150 made of p-GaN was $1.72 \times 10^{-2}$ Ωcm². Flowing a 30-mA current through the sample resulted in a luminous wavelength of about 450 nm, a light output of 35.0 mW, and a forward voltage (Vf) of 3.32V.

As a comparative example, a semiconductor light-emitting device without insulation film 170 formed therein was prepared. In the semiconductor light-emitting device of the comparative example, the contact resistance value was $1.83 \times 10^{-2}$ Ωcm². Flowing a 30-mA current through the semiconductor light-emitting device of the comparative example resulted in a luminous wavelength of about 450 nm, a light output of 33.3 mW, and a forward voltage (Vf) of 3.30V.

The semiconductor light-emitting device of the comparative example had a light output lower than that of the sample by about 5% due to the absence of the effect of reducing ineffective light emission that would be exerted by insulation film 170. The semiconductor light-emitting device of the comparative example and the sample were substantially equivalent in forward voltage.

It is noted that third transparent conductive film 165 is formed under n-side electrode 190 in the present embodiment, however, n-side electrode 190 may be formed on the surface of n-type semiconductor layer 130, without forming third transparent conductive film 165. In this case, the production method of the semiconductor light-emitting device can be achieved in the order of components produced or steps of: (substrate)-(semiconductor layer)-(first transparent conductive film)-(insulation film)-(second transparent conductive film)-(exposed section)-(electrode)-(protective film)-(chip separation)-(packaging).

In the case of forming first transparent conductive film 161 and third transparent conductive film 165 in a single step, the production method of the semiconductor light-emitting device can be achieved in the order of components produced or steps of: (substrate)-(semiconductor layer)-(exposed section)-(first transparent conductive film 161, third transparent conductive film 165)-(insulation film)-(second transparent conductive film 164)-(electrode)-(protective film)-(chip separation)-(packaging).

For diffusing current, a current diffusion layer made of a nitride semiconductor, which is an n-type semiconductor layer, may be formed on p-type semiconductor layer 150. In this case, current flows by the tunneling effect between the current diffusion layer and underlying p-type semiconductor layer 150. In addition, a transparent conductive film may be formed on the current diffusion layer.

As described above, forming first transparent conductive film 161 on p-type semiconductor layer 150 before forming insulation film 170 on p-type semiconductor layer 150 allows an ohmic contact to be obtained between p-type semiconductor layer 150 and first transparent conductive film 161. That is, first transparent conductive film 161 is formed in order to reduce the contact resistance between p-type semiconductor layer 150 and first transparent conductive film 161.

Forming second transparent conductive film 164 on insulation film 170 and first transparent conductive film 161 allows p-side electrode 180 and first transparent conductive film 161 to be electrically connected to each other. Therefore, since only second transparent conductive film 164 is formed on insulation film 170, a current diffusion path in semiconductor light-emitting device 100 is stabilized, and the emission characteristic of semiconductor light-emitting device 100 is stabilized.

A semiconductor light-emitting device and a method of producing the same according to a second embodiment of the present invention will now be described.

Second Embodiment

Figure 18:
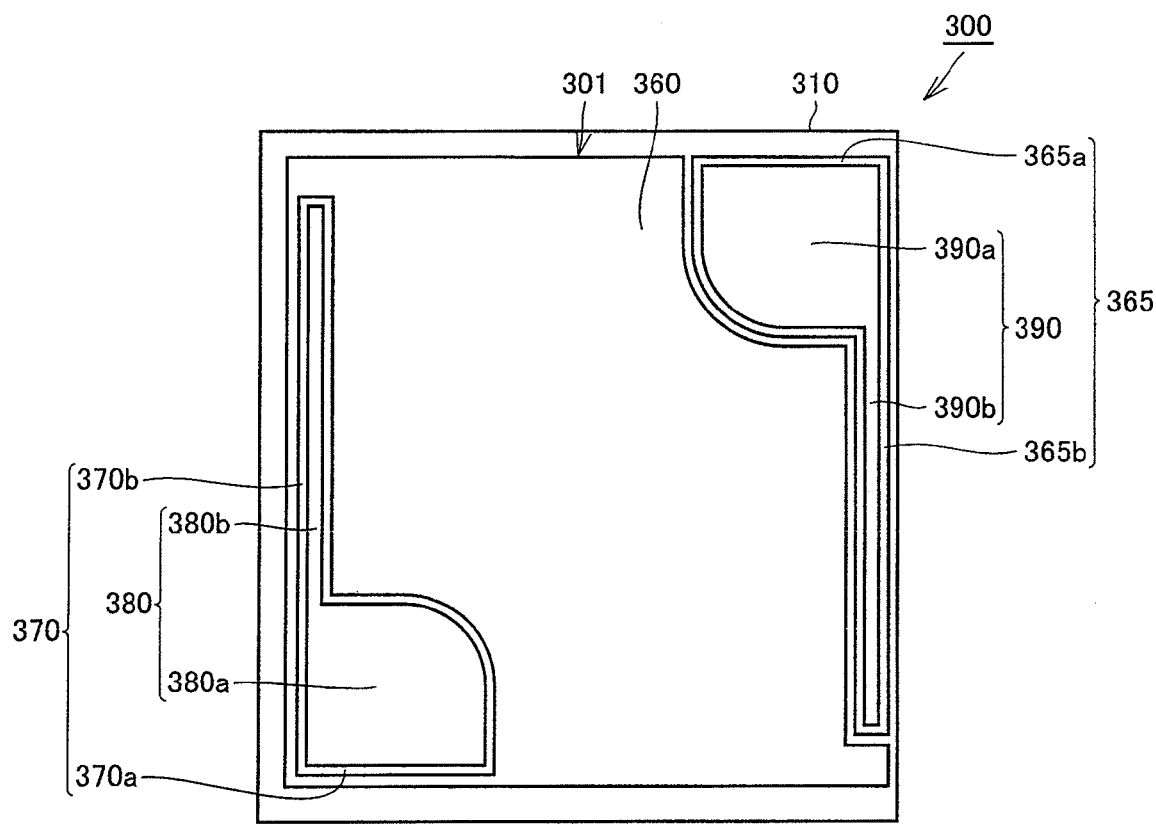
FIG. 18 is a plan view showing a structure of a semiconductor light-emitting device according to a second embodiment of the present invention.

FIG. 18 is a plan view showing a structure of the semiconductor light-emitting device according to the second embodiment of the present invention. It is noted that, for the sake of simplicity, FIG. 18 does not illustrate first and second protective films.

As shown in FIG. 18, in a semiconductor light-emitting device 300 according to the second embodiment of the present invention, a substrate 310 has a 400-μm square configuration. A p-side electrode 380 includes a p-side pad electrode portion 380a and a p-side extension electrode portion 380b extending from an end of p-side pad electrode portion 380a along an edge of substrate 310. An n-side electrode 390 includes an n-side pad electrode portion 390a and an n-side extension electrode portion 390b extending from an end of n-side pad electrode portion 390a along an edge of substrate 310.

P-side pad electrode portion 380a and n-side pad electrode portion 390a are disposed at corners of substrate 310 opposite to each other. P-side extension electrode portion 380b and n-side extension electrode portion 390b are disposed so as to face each other.

It is noted that a pad electrode portion refers to a portion of an electrode to be a connection area for wire bonding. An extension electrode portion is a portion of an electrode for diffusing current throughout an LED chip, and has a form narrower than the width of the pad electrode portion and longer than the length of the pad electrode portion.

For wire bonding or bump formation for flip chip mounting, p-side pad electrode portion 380a and n-side pad electrode portion 390a each need to be sized such that an inscribed circle of each pad electrode portion has a diameter more than or equal to about 60 μm and less than or equal to 100 μm. P-side extension electrode portion 380b and n-side extension electrode portion 390b desirably need to be as narrow as possible in a range where current diffusion is possible, and preferably have a width more than or equal to about 10 μm and less than or equal to 20 μm.

An insulation film 370 is formed under p-side electrode 380. An insulation film 365 is formed under n-side electrode 390. Insulation film 370 includes a portion 370a formed under p-side pad electrode portion 380a, and a portion 370b formed under p-side extension electrode portion 380b. Insulation film 365 includes a portion 365a formed under n-side pad electrode portion 390a, and a portion 365b formed under n-side extension electrode portion 390b.

The cross-sectional structure differs from that of FIG. 2 in that a protective film is formed on each of p-side extension electrode portion 380b and n-side extension electrode portion 390b, and in that the respective components are sized differently, however, the cross-sectional shape from p-side pad electrode portion 380a to n-side pad electrode portion 390a is substantially similar to that of FIG. 2.

It is noted that insulation film 370 may be formed only under p-side pad electrode portion 380a, and insulation film 365 may be formed only under n-side pad electrode portion 390a. In other words, the insulation films do not need to be formed under the extension electrode portions.

A sample of semiconductor light-emitting device 300 of the present embodiment was prepared. Flowing a 30-mA current through semiconductor light-emitting device 300 of the present embodiment resulted in Vf lower than that of semiconductor light-emitting device 100 of the first embodiment by about 5.2%, because of the voltage reduction effect exerted by the extension electrode portions. In a low current region (2 mA), however, characteristics substantially similar to those of the semiconductor light-emitting device of the first embodiment were obtained.

The production method of semiconductor light-emitting device 300 is similar to that of the first embodiment, description of which is therefore not repeated. Semiconductor light-emitting device 300 of the present embodiment also has reduced contact resistance between the transparent conductive film and the semiconductor layer, and stable emission characteristics.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor light-emitting device comprising:
   a substrate;
   an n-type semiconductor layer located above said substrate;
   a semiconductor light-emitting layer located on said n-type semiconductor layer;
   a p-type semiconductor layer located on said semiconductor light-emitting layer;
   an exposed section in which both of said semiconductor light-emitting layer and said p-type semiconductor layer are partially absent on said n-type semiconductor layer when said substrate is seen two-dimensionally from above said substrate;
   an unexposed section other than said exposed section;
   an insulation film located on part of said p-type semiconductor layer in said unexposed section;
   a first transparent conductive film located on substantially the whole of said p-type semiconductor layer where said insulation film is absent in said unexposed section;
   a second transparent conductive film located on said insulation film and said first transparent conductive film;
   an n-side electrode located above said n-type semiconductor layer in said exposed section and electrically connected to said n-type semiconductor layer; and
   a p-side electrode located on said second transparent conductive film above said insulation film and electrically connected to said p-type semiconductor layer.

2. The semiconductor light-emitting device according to claim 1, further comprising:
   a first protective film made of a material identical to that of said insulation film and covering an end face of said semiconductor light-emitting layer located at a boundary between said exposed section and said unexposed section; and
   a second protective film located to cover said first protective film.

3. The semiconductor light-emitting device according to claim 1, further comprising a third transparent conductive film located between said n-side electrode and said n-type semiconductor layer.

* * * * *